United States Patent
Morikawa et al.

(10) Patent No.: US 10,460,976 B2
(45) Date of Patent: Oct. 29, 2019

(54) SUBSTRATE TRANSFER DEVICE AND SUBSTRATE TRANSFER METHOD

(71) Applicant: Tokyo Electron Limited, Tokyo (JP)

(72) Inventors: Katsuhiro Morikawa, Koshi (JP); Yuta Matsushima, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 15/614,706

(22) Filed: Jun. 6, 2017

(65) Prior Publication Data

US 2017/0358479 A1    Dec. 14, 2017

(30) Foreign Application Priority Data

Jun. 13, 2016  (JP) ................... 2016-117383
Jun. 13, 2016  (JP) ................... 2016-117384

(51) Int. Cl.
*H01L 21/687*  (2006.01)
*H01L 21/677*  (2006.01)
(Continued)

(52) U.S. Cl.
CPC .. *H01L 21/68707* (2013.01); *H01L 21/67265* (2013.01); *H01L 21/67766* (2013.01);
(Continued)

(58) Field of Classification Search
CPC ......... H01L 21/67265; H01L 21/67706; H01L 21/67766; H01L 21/67778;
(Continued)

(56) References Cited

U.S. PATENT DOCUMENTS 6,095,582 A * 8/2000 Siniaguine .......... H01L 21/6838
                                                        294/64.3
6,193,807 B1 * 2/2001 Tateyama .............. B25B 11/007
                                                        134/133
(Continued)

FOREIGN PATENT DOCUMENTS

JP        08-107136 A     4/1996
JP        11-031732 A     2/1999
JP       2002-299405 A   10/2002

*Primary Examiner* — Dean J Kramer
(74) *Attorney, Agent, or Firm* — Pearne & Gordon LLP

(57) ABSTRACT

Generation of dust from a peripheral portion of a substrate can be suppressed, and a processed substrate can be suppressed from being adversely affected by a pre-processed substrate. Further, an actual elevation state of the member configured to be moved up and down to support the substrate can be investigated. A substrate transfer device includes a first supporting portion, a second supporting portion and an elevating mechanism. The first supporting portion and the second supporting portion are configured to support a substrate from below the substrate. The elevating mechanism is configured to elevate the second supporting portion up and down between a first position higher than a height of the first supporting portion and a second position lower than the height of the first supporting portion. The substrate transfer device further includes a detecting mechanism configured to detect an elevation state of the second supporting portion.

9 Claims, 15 Drawing Sheets

(51) Int. Cl.
*H01L 21/67* (2006.01)
*B25J 11/00* (2006.01)

(52) U.S. Cl.
CPC .. *H01L 21/67778* (2013.01); *H01L 21/67781* (2013.01); *B25J 11/0095* (2013.01)

(58) Field of Classification Search
CPC .......... H01L 21/67781; H01L 21/68707; B25J 11/0095; Y10S 414/141
USPC ....................................................... 294/213
See application file for complete search history.

(56) References Cited

U.S. PATENT DOCUMENTS

| | | | | |
|---|---|---|---|---|
| 6,837,672 | B1* | 1/2005 | Tateyama | H01L 21/67742 294/188 |
| 7,520,545 | B2* | 4/2009 | Kim | B65G 49/061 294/213 |
| 8,029,224 | B2* | 10/2011 | Abe | H01L 21/67265 198/395 |
| 8,556,318 | B2* | 10/2013 | Wu | H01L 21/68707 294/119.1 |
| 8,696,042 | B2* | 4/2014 | Rebstock | H01L 21/67017 294/119.1 |
| 9,779,977 | B2* | 10/2017 | Embertson | H01L 21/68707 |
| 2010/0178139 | A1* | 7/2010 | Sundar | H01L 21/6831 414/225.01 |
| 2015/0371886 | A1* | 12/2015 | Sato | H01L 21/67259 294/64.3 |
| 2015/0380286 | A1* | 12/2015 | Choi | H01L 21/68707 294/67.22 |

* cited by examiner

SUBSTRATE TRANSFER DEVICE AND SUBSTRATE TRANSFER METHOD

CROSS-REFERENCE TO RELATED APPLICATION

This application claims the benefit of Japanese Patent Application Nos. 2016-117383 and 2016-117384 filed on Jun. 13, 2016, the entire disclosures of which are incorporated herein by reference.

TECHNICAL FIELD

The embodiments described herein pertain generally to a substrate transfer device and a substrate transfer method.

BACKGROUND

Conventionally, there is known a substrate processing apparatus equipped with a multiple number of processing units each configured to perform a preset substrate processing on a substrate such as a semiconductor wafer or a glass substrate.

With regard to a substrate transfer in such a substrate processing apparatus, there is proposed a technique of carrying a substrate into/out of the processing unit while suppressing a processed substrate from being adversely affected by a pre-processed substrate (see, for example, Patent Document 1). Further, there is proposed a technique in which multiple pads configured to support a substrate and configured to be movable up and down by a diaphragm pump are provided as one set and multiple sets are provided. With this technique, by changing elevation states of the multiple sets individually, the substrate before processed and the substrate after processed can be supported at different positions (see, for example, Patent Document 2).

Patent Document 1: Japanese Patent Laid-open Publication No. 2002-299405

Patent Document 2: Japanese Patent Laid-open Publication No. H08-107136

In the first aforementioned prior art, however, since a substrate is supported by being inclined between a multiple number of holders having multi-level support surfaces, a peripheral portion of the substrate come into contact with the holders. Thus, if there is a film or the like on the peripheral portion of the substrate, for example, there is a concern that the film is cut so that dust may be generated from the peripheral portion of the substrate. Further, in the second aforementioned prior art, it is not checked whether the pads are actually elevated into the required elevation state as a fluid is supplied or discharged by the diaphragm pump.

SUMMARY

In view of the foregoing, exemplary embodiments provide a substrate transfer device and a substrate transfer method capable of suppressing generation of dust from a peripheral portion of a substrate and also suppressing a processed substrate from being adversely affected by a pre-processed substrate.

Further, the exemplary embodiments provide a substrate transfer device and a substrate transfer method capable of investigating an actual elevation state of a member configured to be moved up and down to support a substrate.

In one exemplary embodiment, a substrate transfer device includes a first supporting portion, a second supporting portion and an elevating mechanism. The first supporting portion and the second supporting portion are configured to support a substrate from below the substrate. The elevating mechanism is configured to elevate the second supporting portion up and down between a first position higher than a height of the first supporting portion, which is maintained fixed, and a second position lower than the height of the first supporting portion.

In another exemplary embodiment, a substrate transfer device includes a base portion, a supporting portion, an elevating mechanism and a detecting mechanism. The base portion of a holding unit is configured to hold a substrate. The supporting portion is provided at the base portion and configured to support the substrate from below the substrate. The elevating mechanism is configured to move the supporting portion up and down with respect to the base portion. The detecting mechanism is configured to detect an elevation state of the supporting portion.

According to the exemplary embodiment, it is possible to suppress the generation of dust from the peripheral portion of the substrate and, also, to suppress the processed substrate from being adversely affected by the pre-processed substrate.

According to the exemplary embodiment, it is possible to investigate the actual elevation state of the member configured to be moved up and down to support the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
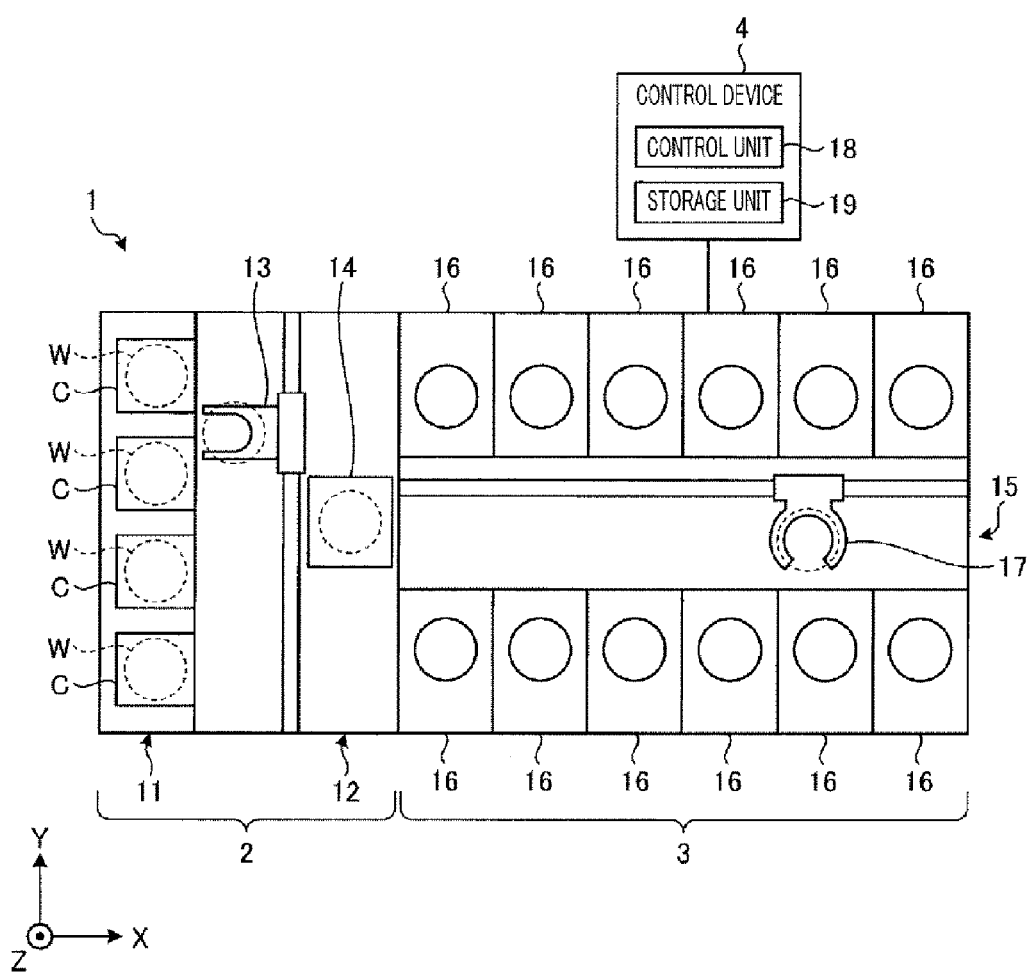
FIG. 1 is a plan view illustrating an outline of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a substrate transfer device and a substrate transfer method according to exemplary embodiments will be explained in detail with reference to the accompanying drawings. It should be noted that the following exemplary embodiments are not intended to be anyway limiting.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
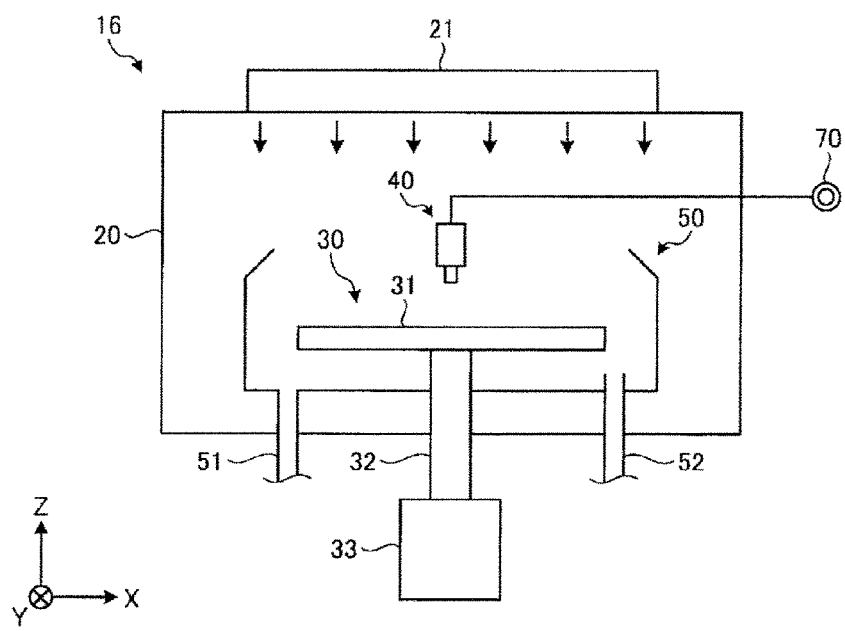
FIG. 2 is a diagram illustrating an outline of a processing unit.

Now, an outline of the processing unit 16 will be explained with reference to FIG. 2. FIG. 2 is a diagram illustrating the outline of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

<Configuration of Substrate Transfer Device 13>

Figure 3A:
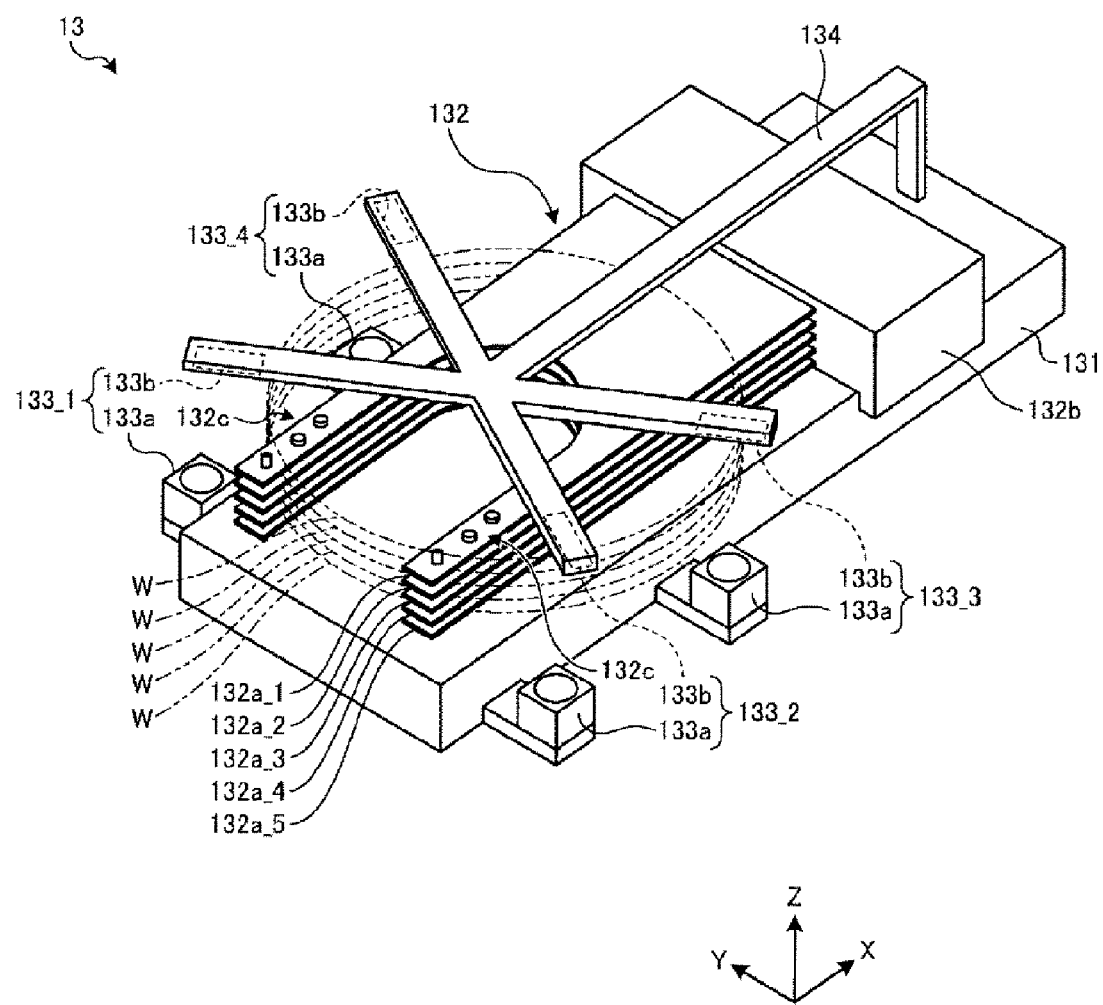
FIG. 3A is a perspective view illustrating a configuration of a first transfer device.
Figure 3B:
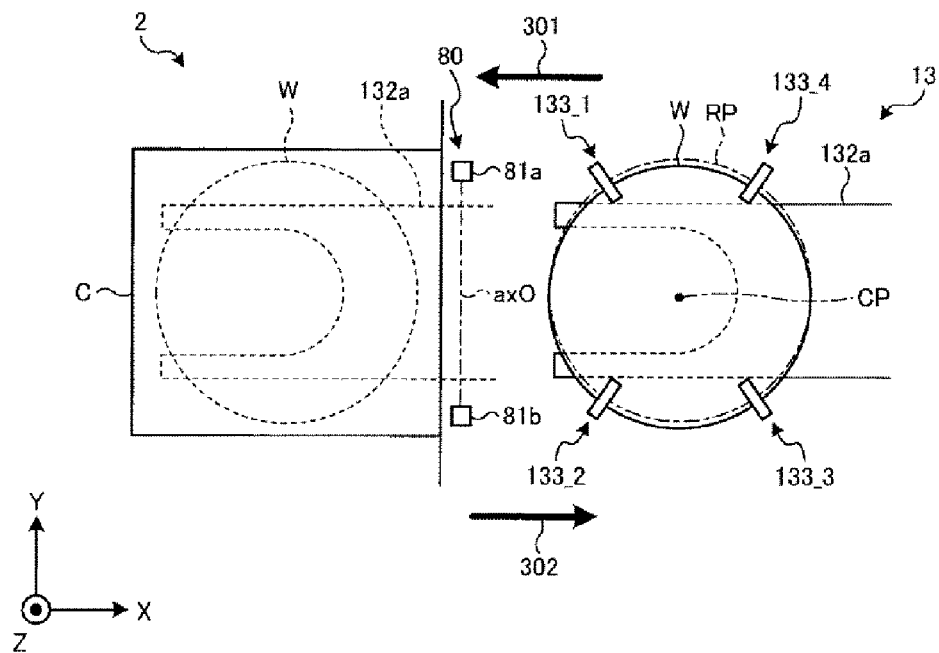
FIG. 3B is a schematic plan view illustrating an operation example of the first transfer device.

Now, a configuration of the substrate transfer device 13 (corresponding to an example of a "first transfer device") will be explained with reference to FIG. 3A and FIG. 3B. FIG. 3A is a perspective view illustrating the configuration of the substrate transfer device 13. FIG. 3B is a schematic plan view illustrating an operation example of the substrate transfer device 13.

As depicted in FIG. 3A, the substrate transfer device 13 according to the present exemplary embodiment includes a base 131, a holding unit 132, a multiple number of (here, four) detecting unit 133_1 to 133_4, and a supporting member 134.

The base 131 is configured to be movable along the Y-axis direction and pivotable around the Z-axis. The holding unit 132, the detecting units 133_1 to 133_4 and the supporting member 134 are provided at the base 131.

The holding unit 132 is configured to hold a multiple number of wafers W in multiple levels. To elaborate, the holding unit 132 is equipped with a multiple number of (here, five) forks 132a_1 to 132a_5; and a moving mechanism 132b configured to move the forks 132a_1 to 132a_5 forwards and backwards along the X-axis direction with respect to the base 131.

The forks 132a_1 to 132a_5 are arranged in multiple levels in the Z-axis direction. The holding unit 132 is capable of holding wafers W on the individual forks 132a_1 to 132a_5 and transferring the wafers W at once (here, transferring five sheets of wafers W at one time). In the following description, the forks 132a_1 to 132a_5 will be generically referred to as a "fork 132a."

The fork 132a has a bifurcated shape having a width smaller than a diameter of a wafer W. Further, the fork 132a has a plurality of supporting portions 132c. Each of the supporting portions 132c is a member that holds the wafer W thereon by a frictional force from below. Details of the supporting portions 132c will be explained later with reference to FIG. 3C and so forth.

The detecting units 133_1 to 133_4 detect an edge of the wafer W held on the holding unit 132 at different positions. Each of the detecting units 133_1 to 133_4 includes a light projecting unit 133a and a light receiving unit 133b.

The light projecting unit 133a and the light receiving unit 133b are provided at an upper position and a lower position, respectively, with the wafer W held by the holding unit 132 therebetween when the holding unit 132 is placed at a retreated position (hereinafter, referred to as "home position") in the positive X-axis direction. The light projecting unit 133a is located under the holding unit 132 and is fixed to the base 131. The light receiving unit 133b is located above the holding unit 132 and is connected to the base 131 with the supporting member 134 to be described later therebetween.

The light receiving unit 133b is a sensor group in which a multiple number of light receiving elements are arranged in a straight line shape. This light receiving unit 133b may be implemented by, by way of non-limiting example, a linear image sensor. In the present exemplary embodiment, it is assumed that the light receiving unit 133b is the linear image sensor.

Each of the light receiving units 133b is arranged such that an arrangement direction of the light receiving elements thereof is along a radial direction extended from a center of the wafer W in case that the holding unit 132 is located at the home position and the wafer W is normally placed on the holding unit 132. Here, "wafer W is normally placed" refers to a state in which the wafer W is maintained at a "reference position" without being deviated, where the wafer W can be transferred normally.

The supporting member 134 is configured to support the light receiving units 133b such that the light receiving units 133b are located above the holding unit 132. The example shown in FIG. 3A, however, does not limit the shape of the supporting member 134.

Meanwhile, each light projecting unit 133a includes a light source and a lens which are not illustrated. The light source irradiates diffuse light. The lens is provided above the light source and refracts the diffuse light irradiated from the light source, thus allowing parallel light to be irradiated toward the corresponding light receiving unit 133b that makes a pair therewith.

The parallel light irradiated toward the light receiving unit 133b from the light projecting unit 133a is partially blocked by the wafer W held by the holding unit 132. Thus, in the light receiving unit 133b, there is generated a difference in a light receiving amount between a light receiving element that has received the parallel light from the light projecting unit 133a and a light receiving element that has not received the parallel light. Each of the detecting units 133_1 to 133_4 is configured to detect the edge of the wafer W based on such a difference of the light receiving amount and output a detection result to the control unit 18.

Such detection of the edge of the wafer W is performed after the substrate transfer device 13 takes out the wafer W from the carrier C by advancing the fork 132a into the carrier C and retreats the fork 132a to the home position, as illustrated in FIG. 3B, for example (see arrows 301 and 302 in the figure). Based on the received detection result, the control unit 18 calculates a deviation amount of the wafer W from a reference position RP and a center position CP thereof. Based on the calculated deviation amount, the control unit 18 may correct the position of the holding unit 132, for example.

Further, though not shown in FIG. 1, substrate detecting mechanisms 80 each configured to detect the wafer W accommodated in the carrier C are provided in the carry-in/out station 2 to respectively correspond to the carriers C, as shown in FIG. 3B.

Each substrate detecting mechanism 80 includes a light projecting unit 81a configured to irradiate light in the horizontal direction; and a light receiving unit 81b configured to receive the light irradiated from the light projecting unit 81a. The substrate detecting mechanism 80 is provided between a carry-in/out opening of the corresponding carrier C and the substrate transfer device 13 such that an optical axis axO is formed along the Y-axis. Further, the substrate detecting mechanism 80 is also configured to be capable of moving the optical axis axO along the X-axis and the Z-axis.

The substrate detecting mechanism 80 optically detects an accommodation state of the wafer W within the carrier C by advancing the optical axis axO into the carrier C and blocking the optical axis axO by the wafer W. Details of the substrate detecting mechanism 80 will be explained later with reference to FIG. 4A and so forth.

<Configuration of Holding Unit 132 and Holding Method of Wafer W by Holding Unit 132>

Figure 3C:
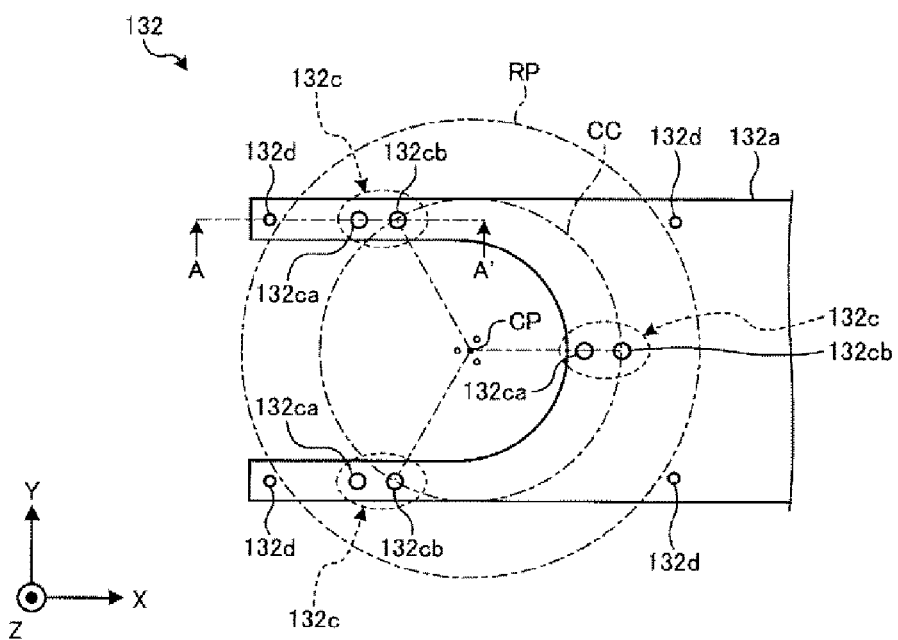
FIG. 3C is a plan view illustrating a configuration of a holding unit.
Figure 3D:
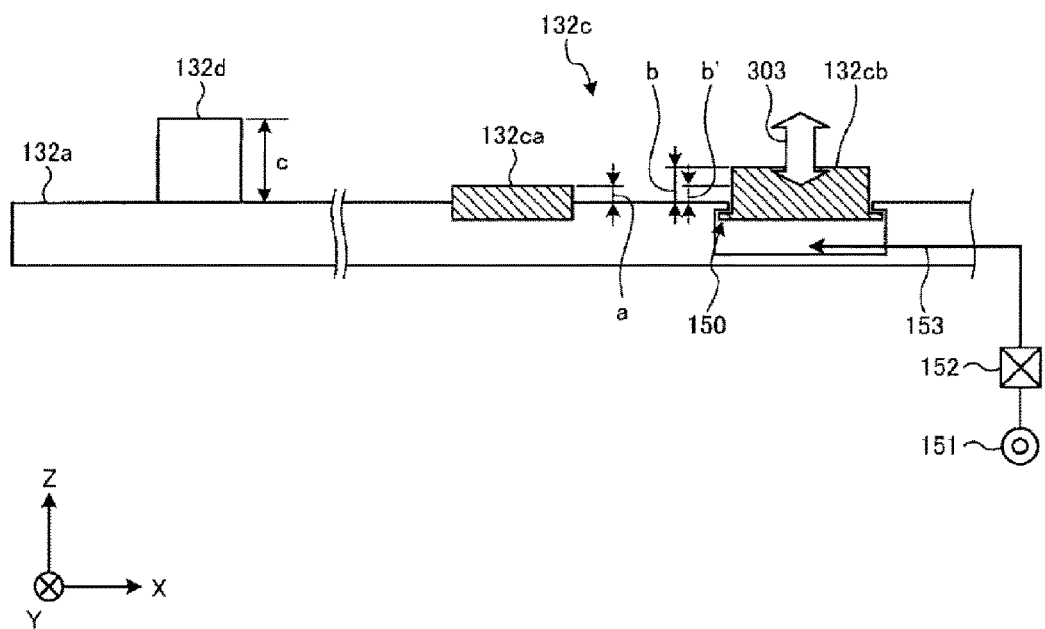
FIG. 3D is a schematic cross sectional view taken along a line A-A' of FIG. 3C.

Now, a configuration of the holding unit 132 and a holding method of the wafer W by the holding unit 132 will be explained in further detail with reference to FIG. 3C to FIG. 3G. FIG. 3C is a plan view illustrating the configuration of the holding unit 132, and FIG. 3D is a schematic cross sectional view taken along a line A-A' of FIG. 3C.

Figure 3E:
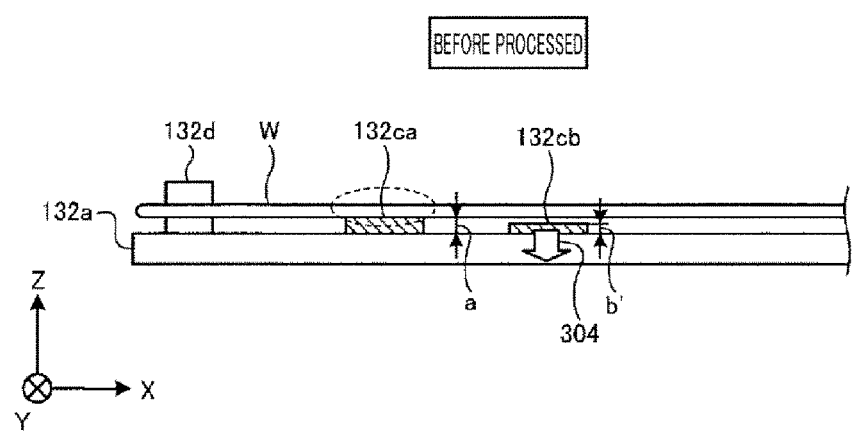
FIG. 3E is a first schematic diagram illustrating a holding method of a wafer by the holding unit.
Figure 3F:
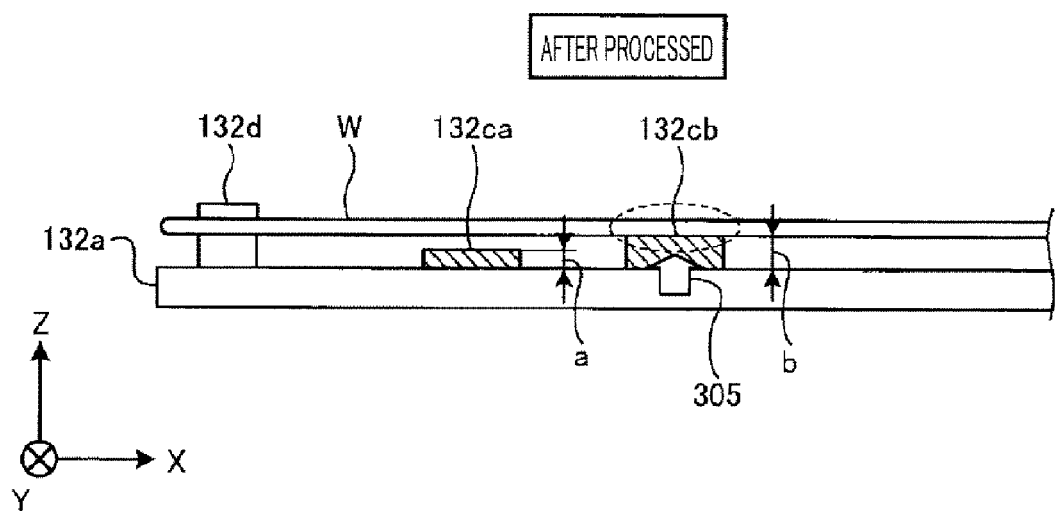
FIG. 3F is a second schematic diagram illustrating the holding method of the wafer by the holding unit.
Figure 3G:
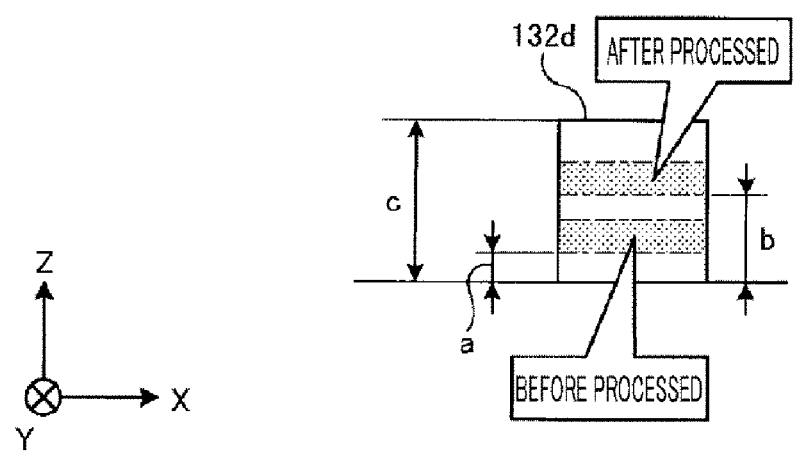
FIG. 3G is a third schematic diagram illustrating the holding method of the wafer by the holding unit.

Further, FIG. 3E to FIG. 3G are first to third schematic diagrams illustrating the holding method of the wafer W by the holding unit 132.

As depicted in FIG. 3C, the holding unit 132 according to the present exemplary embodiment includes the fork 132a, a plurality of (here, three) supporting portions 132c and a multiple number of (here, four) deviation preventing pins 132d. Here, illustration of the moving mechanism 132b is omitted.

The fork 132a is a member corresponding to a base portion of the holding unit 132 and is made of ceramic or the like. As mentioned above, the fork 132a has the bifurcated shape. The supporting portions 132c are members which hold the wafer W thereon by a frictional force from below. For example, the supporting portions 132c are provided at one branch of the bifurcated shape of the fork 132a, at the other branch thereof and a base portion of the branches, respectively.

Further, each of the supporting portions 132c includes a fixed pad 132ca and an elevation pad 132cb. The fixed pad 132ca and the elevation pad 132cb have substantially circular shapes when viewed from the top. The fixed pad 132ca is provided at a position closer to a tip end of the fork 132a than the elevation pad 132cb that makes a pair is provided. Further, at least the surfaces of the fixed pad 132ca and the elevation pad 132cb that come into contact with the wafer W may be made of, by way of non-limiting example, rubber.

Further, the elevation pads 132cb are equi-spaced on a circumference of a concentric circle CC which is imaginarily drawn from the center position CP of the reference position RP. That is, in the example shown in FIG. 3C, three elevation pads 132cb are arranged on the circumference of the concentric circle CC at an equal angular interval of 120°. Further, the fixed pads 132ca may be arranged on a circumference of a single circle different from the concentric circle CC.

The deviation preventing pins 132d are members configured to suppress the wafer W from being deviated over a tolerance limit or from falling down by a centrifugal force or the like while transferring the wafer W, and are arranged at positions where the deviation of the wafer W can be restricted within the tolerance limit. Accordingly, the deviation preventing pins 132d are arranged at the positions where a preset gap, which allows the deviation within the tolerance limit, is formed between the deviation preventing pins 132d and the periphery of the wafer W which is provided at the reference position RP. The deviation preventing pins 132d are protruded from the fork 132a in the positive Z-axis direction.

The supporting portions 132c and the deviation preventing pins 132d will be further elaborated. As shown in FIG. 3D, each fixed pad 132ca is provided such that its protruding portion from the fork 132a has a height a.

In contrast, each elevation pad 132cb is provided such that its protrusion portion from the fork 132a is movable up and down between a height b' lower than the height a and a height b higher than the height a (see an arrow 303 in the figure). This elevation pad 132cb is moved up and down by the elevating mechanism 150. Further the height position of the height b corresponds to an example of a "first position," and the height position of the height b' corresponds to an example of a "second position."

By way of example, the elevating mechanism 150 is provided within the fork 132a below the elevation pad 132cb and is configured to move the elevation pad 132cb up and down by using, for example, an air pressure.

In case of using such an air pressure, an air supply line 153 is provided within the fork 132a, as depicted in FIG. 3D. The air supply line 153 is connected to a valve 152 and serves to supply/exhaust air from an air supply source 151 into/from an internal space of the elevating mechanism 150 by an operation of the valve 152.

The elevating mechanism 150 moves the elevation pad 132cb up and down according to a variation in an internal pressure thereof caused by the supply/exhaust of the air into/from the air supply line 153. That is, the elevating mechanism 150 moves the elevation pad 132cb upwards as the pressure within the internal space of the elevating mechanism 150 is increased as the air is supplied from the air supply line 153, and moves the elevation pad 132cb downwards as the pressure within the internal space of the elevating mechanism 150 is reduced as the air is exhausted from the air supply line 153. These operations are controlled by the control unit 18.

Further, the example of using the air pressure described herein is not limiting at all and does not limit the structure of the elevating mechanism 150. By way of another example, an actuator or the like may be used.

Each deviation preventing pin 132d is provided such that its protruding portion from the fork 132a has a height c higher than the height b of the elevation pad 132cb.

Here, as a comparative example, an example of a conventional holding method of a wafer W will be explained. In the prior art, a plurality of supporting portions are provided at a fork in multiple levels, and wafers W are held inclined between the different levels of the plurality of supporting portions.

Further, in order to avoid re-contamination of a processed wafer W caused by being adversely affected from a pre-processed wafer W, for example, by a transfer of a particle, directions of inclining the wafers W are set to be different for the pre-processed wafer W and the processed wafer W, so that the wafer W does not come into contact with same portions of the supporting portions before and after a processing.

In the prior art, however, a peripheral portion of the wafer W comes into contact with the supporting portions. Thus, in case that there is a film or the like formed on the peripheral portion of the wafer W, there is a concern that the film may be cut or the like, so that a particle may be generated from the peripheral portion of the wafer W.

In view of this problem, according to the present exemplary embodiment, as depicted in FIG. 3E, when holding the wafer W "before processed," the elevation pad 132cb is lowered (see an arrow 304 in the figure) to a height (for example, the height b') lower than the height a, and the wafer W is held only by the fixed pad 132ca (see a portion encircled by a closed curve in the figure).

Furthermore, in the present exemplary embodiment, as depicted in FIG. 3F, when holding the wafer W "after processed," the elevation pad 132cb is raised (see an arrow 305 in the figure) to a height (for example, the height b) higher than the height a, and the wafer W is held only by the elevation pad 132cb (see a portion encircled by a closed curve in the figure).

Accordingly, since the wafer W is held by the different portions of the supporting portions 132c before and after the processing, the processed wafer W can be suppressed from being re-contaminated by being adversely affected from the pre-processed wafer W, by a transfer of a particle, for example.

Furthermore, even if the wafer W is deviated from the reference position RP, if the deviation amount is within the tolerance limit, there is a low possibility that the peripheral portion of the wafer W may come into contact with the deviation preventing pin 132d. Therefore, particle generation from the peripheral portion of the wafer W can be suppressed.

In addition, even if the wafer W comes into contact with the deviation preventing pin 132d, the wafer W "after processed" is brought into contact with the deviation preventing pin 132d at the height b which is higher than the height a of the wafer W "before processed," that is, at a different height.

Thus, the particle adhering to the wafer W "before processed" can be suppressed from adhering to the wafer W "after processed" by being transferred through the deviation preventing pin 132d, so that the wafer W "after the processing" can be suppressed from being re-contaminated.

Moreover, even if the particle transferred to the deviation preventing pin 132d from the wafer W "before processed" falls down, the wafer W "after processed" maintained at the height b higher than the height a may not be affected thereby due to the effect of gravity. Thus, recontamination of the wafer W "after processed" can be suppressed.

<When Detecting Elevation State of Elevation Pad 132cb>

Regarding each elevation pad 132cb, it is already stated above that the elevation pad 132cb is moved up and down based on the operation of the elevating mechanism 150 which is controlled by the control unit 18. In order to securely hold the wafer W at the different portions of the supporting portions 132c before and after the processing, however, it is desirable to detect whether the elevation pad 132cb is actually in a required elevation state which is based on the control of the control unit 18.

In this regard, in the present exemplary embodiment, an actual elevation state of the elevation pad 132cb is detected by the aforementioned substrate detecting mechanism 80 (see FIG. 3B), and if the elevation pad 132cb is in the required elevation state, the wafer W is held by the supporting portions 132c and then is transferred.

Accordingly, it is possible to suppress an adverse influence upon the processed wafer W from the pre-processed wafer that might be caused by holding the wafer W on the same portion of the supporting portions 132c before and after the processing when the elevation pad 132cb is not in the required elevation state because of, for example, a problem in the elevation mechanism 150.

Figure 4A:
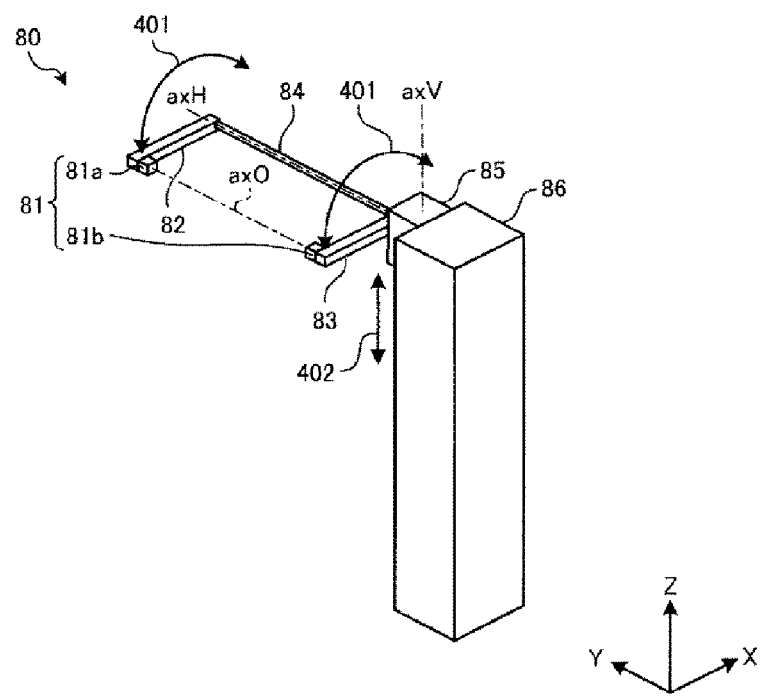
FIG. 4A is a perspective view illustrating a configuration of a substrate detecting mechanism.

Detection of the elevation state of the elevation pad 132cb using the substrate detecting mechanism 80 will be described in further detail with reference to FIG. 4A to FIG. 4F. FIG. 4A is a perspective view illustrating a configuration of the substrate detecting mechanism 80.

Figure 4B:
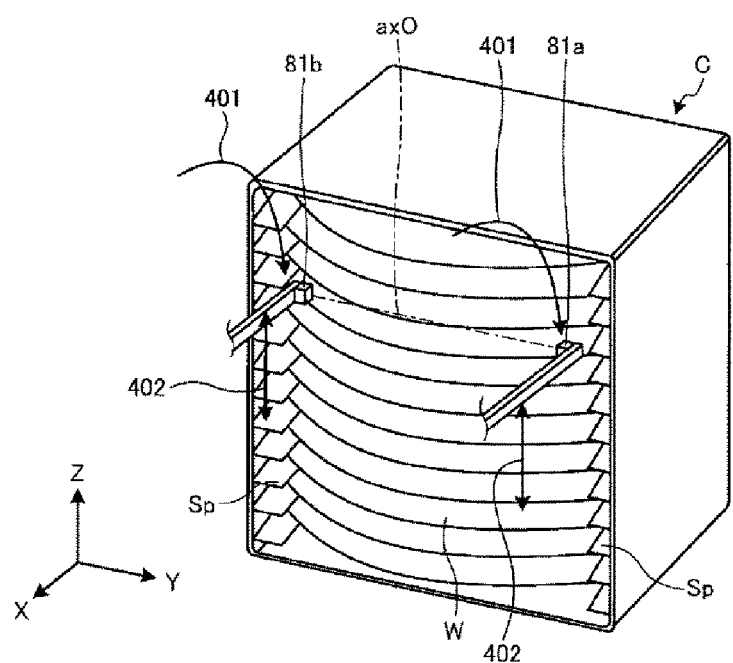
FIG. 4B is a diagram for describing a case of detecting an accommodation state of wafers within a carrier.

Further, FIG. 4B is a diagram for describing a case of detecting an accommodation state of the wafers W within the carrier C. FIG. 4C to FIG. 4F are first to fourth diagrams for describing a case of detecting the elevation state of the elevation pad 132cb.

As shown in FIG. 4A, the substrate detecting mechanism 80 includes an optical sensor 81, supporting arms 82 and 83, a supporting shaft 84, a rotating mechanism 85 and an elevating mechanism 86. The optical sensor 81 includes the aforementioned light projecting unit 81a and light receiving unit 81b.

The supporting arm 82 is configured to support the light projecting unit 81a with a tip end portion thereof, and a base end portion of the supporting arm 82 is supported at the supporting shaft 84. The supporting arm 83 is configured to support the light receiving unit 81b with a tip end portion thereof, and a base end portion thereof is supported at the supporting shaft 84.

The supporting shaft 84 is configured to support the supporting arms 82 and 83 in parallel to each other such that the optical axis axO is formed by the light projecting unit 81a and the light receiving unit 81b along the Y-axis. Further, the supporting shaft 84 is configured to be rotatable around a horizontal axis axH with respect to the rotating mechanism 85. As the supporting shaft 84 is rotated, the optical sensor 81 is also rotated around the horizontal axis axH (see an arrow 401 in the figure).

The rotating mechanism 85 has therein a non-illustrated driving unit composed of, for example, a motor or the like. The rotating mechanism 85 rotates the supporting shaft 84 around the horizontal axis axH by this driving unit.

For example, at the negative Y-axis side further than is a carry-in/out opening of the carrier C, the elevating mechanism 86 is located at a position where it can support the rotating mechanism 85 without interfering with the carrying-in/out of the wafer W. Further, the elevating mechanism 86 has therein a non-illustrated driving unit composed of, for example, a motor or the like, and elevates the rotating mechanism 85 up and down along a vertical axis axV by this driving unit. As the rotating mechanism 85 is elevated up and down, the optical sensor 81 is also moved up and down along the vertical axis axV (see an arrow 402 in the figure). Further, a position control over the optical sensor 81 by combination of the operations of the rotating mechanism 85 and the elevating mechanism 86 is performed by the control unit 18.

As depicted in FIG. 4B, in case of detecting the accommodation state of the wafers W within the carrier C, the control unit 18 performs the position control over the optical sensor 81 such that the optical sensor 81 (the light projecting unit 81a and the light receiving unit 81b) is advanced into the carrier C and scanning by the optical axis axO is enabled (see arrows 401 and 402 in the figure).

Furthermore, as depicted in FIG. 4B, the carrier C is a box body whose end surface at the positive X-axis side along an YZ plane is opened as the carry-in/out opening. Pairs of supporting portions Sp configured to support peripheral portions of the wafer W are provided in multiple levels at an inner wall along an XZ plane. The wafer W is accommodated in the carrier C horizontally by being supported by these supporting portions Sp.

With this configuration, by performing the aforementioned position control over the optical sensor 81 based on, for example, a height position of each supporting portion Sp within the carrier C, the control unit 18 detects the accommodation state of the wafer W within the carrier C based on a light blocking result that the optical axis axO is blocked.

The accommodation state of the wafer W includes presence or absence of the wafer W on each level within the carrier C, an apparent thickness of the wafer W when viewed from a lateral side of the carrier C, and so forth. By way of example, in case that the wafer W is sustained inclined, not horizontally, with respect to the supporting portions Sp, the apparent thickness of the wafer W is thickened. Thus, based on detection data of this apparent thickness, the control unit 18 is capable of determining the accommodation posture of the wafer W. Further, FIG. 4B does not limit the number of wafers W accommodated in the carrier C.

Figure 4C:
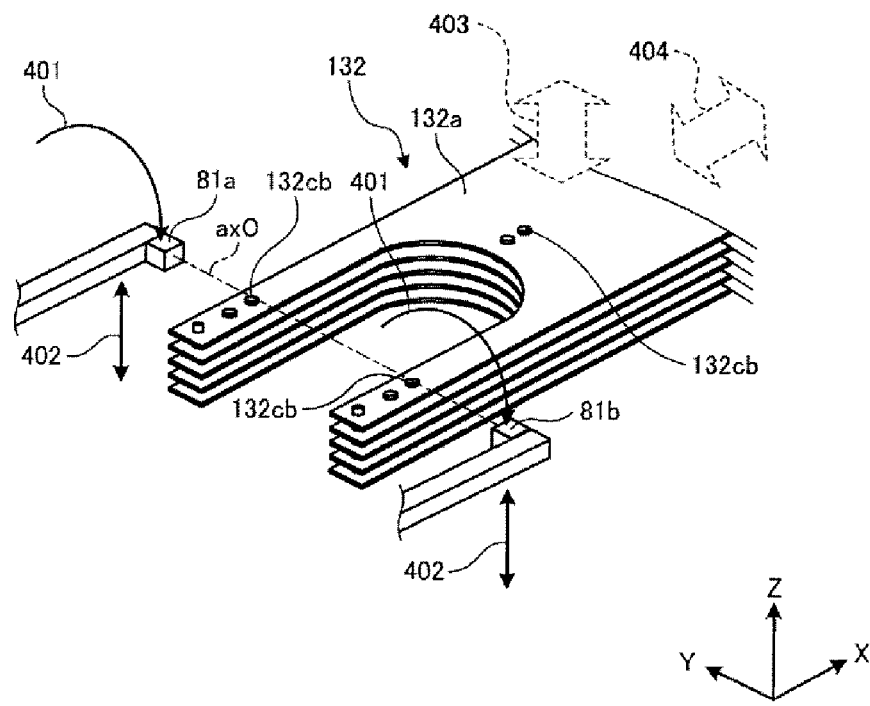
FIG. 4C is a first diagram for describing a case of detecting an elevation state of elevation pads.

Furthermore, as shown in FIG. 4C, in case of detecting the elevation state of the elevation pad 132cb, the control unit 18 rotates the optical sensor 81 (the light projecting unit 81a and the light receiving unit 81b) toward the positive X-axis direction where the holding unit 132 is located, and performs the position control over the optical sensor 81 such that the elevation pad 132cb can be scanned by the optical axis axO (see arrows 401 and 402 in the figure).

At this time, the control unit 18 may combine an operation control over the holding unit 132, for example, a Z-axis directional operation and an X-axis directional operation along with the position control over the optical sensor 81 (see arrows 403 and 404 in the figure). Besides, a control over a Y-axis directional operation thereof may be further combined.

Figure 4D:
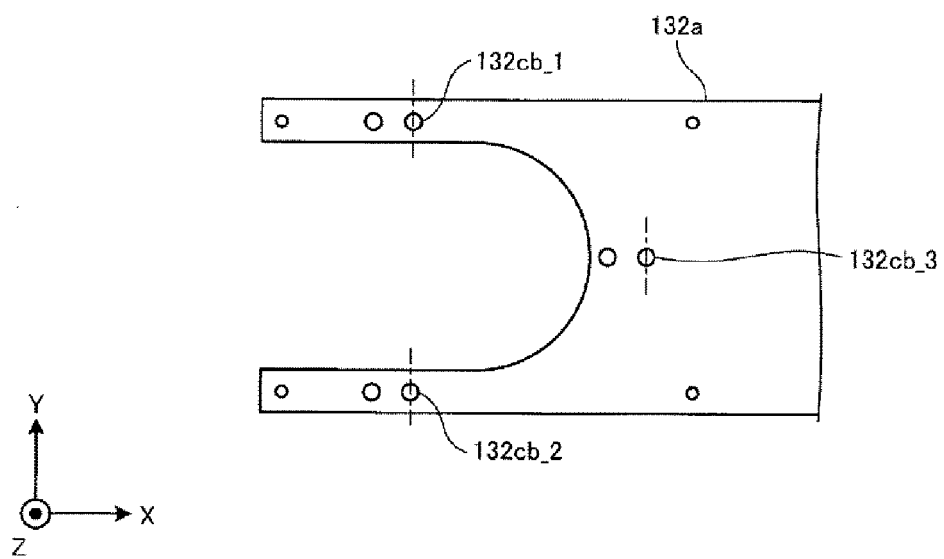
FIG. 4D is a second diagram for describing the case of detecting the elevation state of the elevation pads.

Through this combination of the position control and the operation control, the control unit 18 detects the elevation states of the respective elevation pads 132cb_1 to 132cb_3 by overlapping the optical axis axO with the elevation pads 132cb_1 to 132cb_3 individually, as shown in FIG. 4D.

Further, in overlapping the optical axis axO with the elevation pads individually, in case that the elevation pads such as the elevation pads 132cb_1 and 132cb_2 are located at the same position with respect to the X-axis, for example, a rotating operation of the aforementioned base 131 (see FIG. 3A) around the Z-axis may be further combined.

Figure 4E:
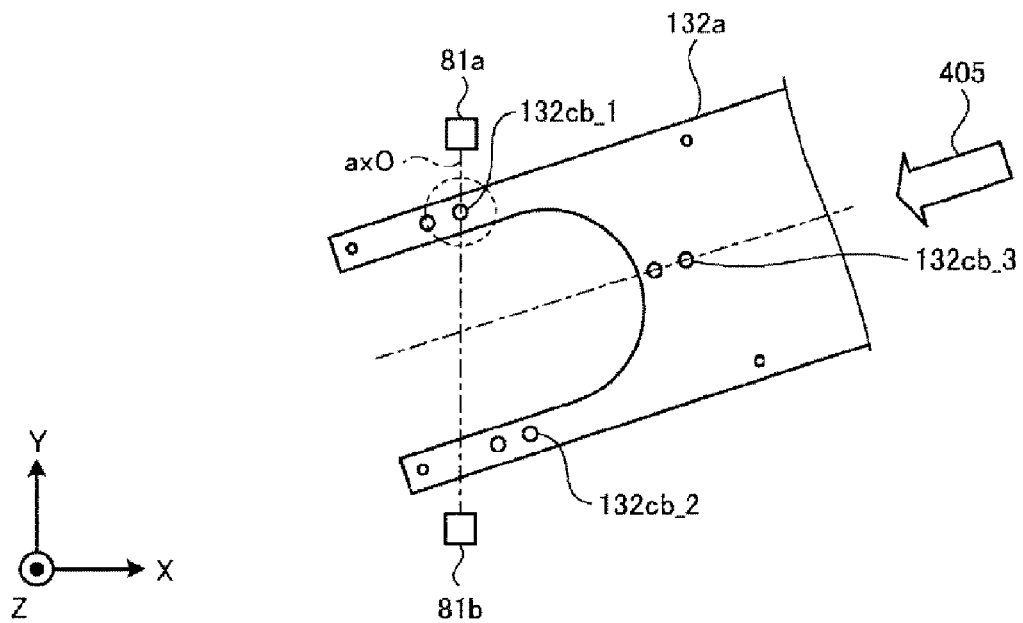
FIG. 4E is a third diagram for describing the case of detecting the elevation state of the elevation pads.

To elaborate, as illustrated in FIG. 4E, after rotating the base 131 around the Z-axis such that the central axis of the fork 132a is inclined with respect to the optical axis axO, the fork 132a may be advanced forwards (see an arrow 405 in the figure), for example, so that the optical axis axO is allowed to be overlapped with the elevation pads 132cb_1 and 132cb_2 individually.

FIG. 4E illustrates an example of allowing the optical axis axO to be overlapped with the elevation pad 132cb_1, as indicated by a portion encircled by a closed curve of dashed line.

By the combination of the position control over the optical sensor 81 and the operation control over the holding unit 132 as stated above, the control unit 18 can scan each elevation pad 132cb by the optical axis axO in a thickness direction of the elevation pad 132cb and can detect the elevation state of the elevation pad 132cb.

Figure 4F:
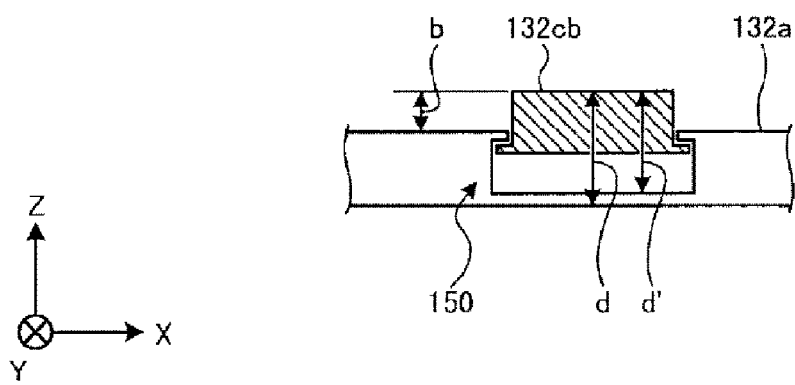
FIG. 4F is a fourth diagram for describing the case of detecting the elevation state of the elevation pads.

To elaborate, as shown in FIG. 4F, it is detected whether the elevation pad 132cb is normally raised up to the height b.

In this case, if the fork 132a, for example, has low light transmissivity, the control unit 18 determines, based on the detection result of the optical sensor 81, that the elevation pad 132cb is normally raised if a light-blocked portion having a length d equivalent to a sum of the thickness of the fork 132a and the height b is detected. Further, if the light-blocked portion does not reach the length d, it is determined that the elevation pad 132cb is not normally raised.

Meanwhile, if the fork 132a has high light transmissivity, the control unit 18 determines, based on the detection result of the optical sensor 81, that the elevation pad 132cb is normally raised if the light-blocked portion having a length d' equivalent to a sum of a thickness of the elevating mechanism 150 and the height b is detected. Further, if the light-blocked portion does not reach the length d', it is determined that the elevation pad 132cb is not normally raised.

As another example, if it is detected that the elevation pad 132cb is raised to, for example, a height position at least higher than the height a (see FIG. 3D, etc.) of the fixed pad 132ca, it may be regarded that the elevation pad 132cb is normally elevated up. That is, the elevation state of the elevation pad 132cb can be determined if the substrate detecting mechanism 80 is capable of detecting at least an external surface of the elevation pad 132cb.

So far, though the description has been provided for the example of detecting whether the elevation pad 132cb is normally raised, the same method can also be applied to detecting another elevation state, for example, whether the elevation pad 132cb is normally lowered.

If the elevation pad 132cb is found to be in the required elevation state, the control unit 18 transfers the wafer W between the carrier C and the delivery unit 14 by using the substrate transfer device 13. Meanwhile, if the elevation pad 132cb is found not to be in the required elevation state, the control unit 18 stops, for example, the transfer of the wafer W by the substrate transfer device 13.

As stated above, the actual elevation state of the elevation pad 132cb is detected by the substrate detecting mechanism 80, and if the elevation pad 132cb is in the required elevation state, the wafer W is held by the supporting portions 132c and then is transferred. Thus, the wafer W can be securely held on the different portions of the supporting portions 132c before and after the processing. That is, it is possible to suppress the adverse influence upon the processed wafer W from the pre-processed wafer W.

Further, as for the timing for detecting the elevation state of the elevation pad 132cb by the substrate detecting mechanism 80, the detection may be performed every time the substrate transfer device 13 accesses the carrier C, or every time a preset number of wafers W is processed. Also, the detection may be performed whenever the carrier C is replaced or may be performed only for the first carrier C which is prepared every day. Moreover, the detection may be performed whenever a preset time or days have elapsed.

<Transfer Sequence of Wafer W Between Carrier C and Delivery Unit 14>

Figure 5:
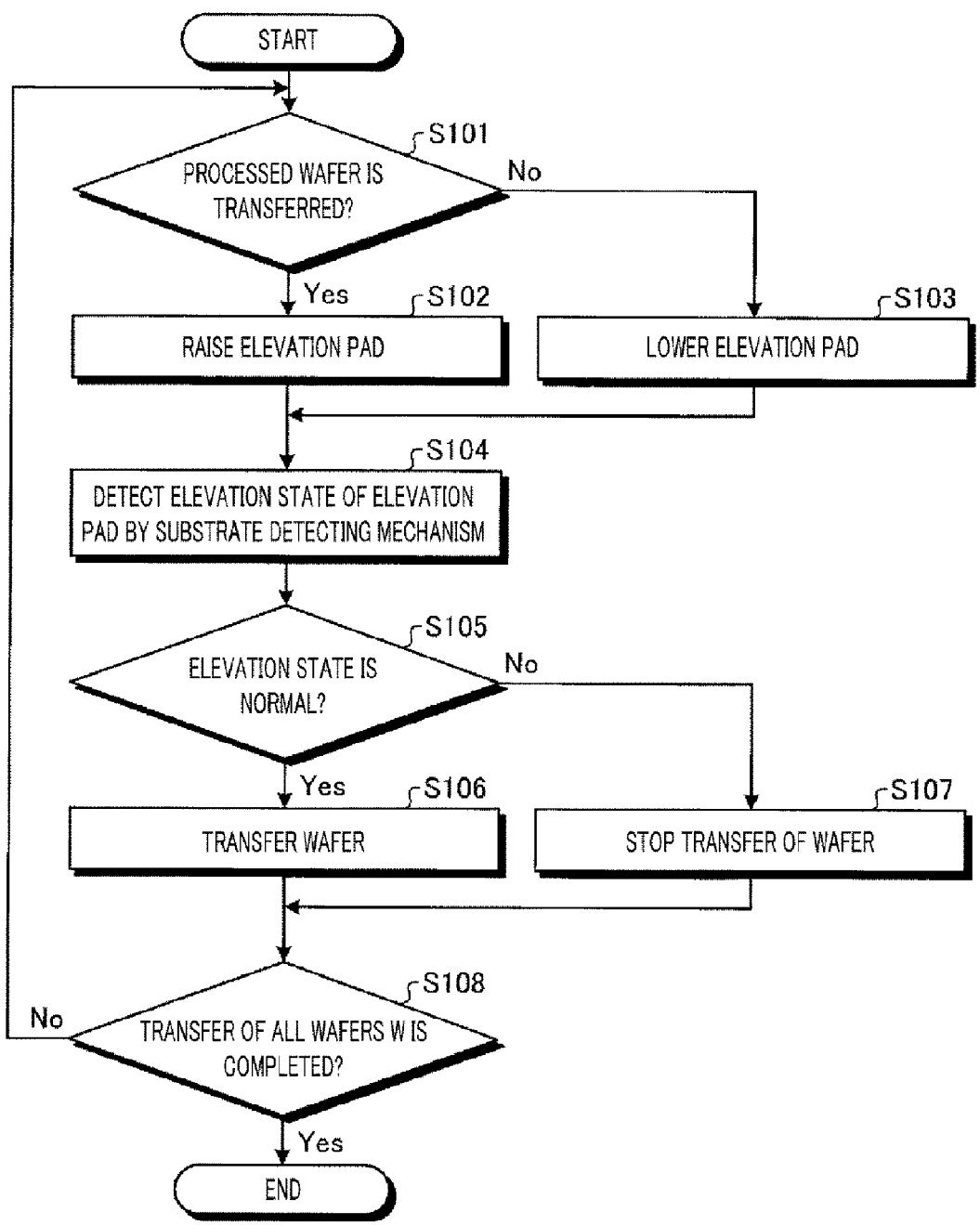
FIG. 5 is a flowchart for describing a processing sequence of a wafer transfer process between a carrier and a delivery unit.

Now, a processing sequence of a transfer processing, in which the control unit 18 controls the substrate transfer device 13, the substrate detecting mechanism 80 and so forth to transfer the wafer W between the carrier C and the delivery unit 4, will be explained with reference to FIG. 5. FIG. 5 is a flowchart for describing the processing sequence of the transfer processing of transferring the wafer W between the carrier C and the delivery unit 14. Here, the elevation state of the elevation pads 132cb is detected whenever the wafer W is transferred.

As shown in FIG. 5, the control unit 18 determines whether a next transfer between the carrier C and the delivery unit 14 is a transfer of a processed wafer W based on, e.g., recipe information in which a processing sequence of a substrate processing is previously set (process S101).

Here, if it is a case where the processed wafer W is to be transferred (process S101: Yes), the control unit 18 raises the elevation pads 132cb (process S102). Meanwhile, if it is not the case where the processed wafer W is to be transferred (but a case where a pre-processed wafer W is transferred) (process S101: No), the control unit 18 lowers the elevation pads 132cb (process S103).

Subsequently, the control unit 18 detects the elevation state of the elevation pads 132cb by the substrate detecting mechanism 80 (process S104). Then, based on the detection result, the control unit 18 determines whether the elevation state of the elevation pads 132cb is normal (process S105).

Here, if the elevation state of the elevation pads 132cb is normal (process S105: Yes), the control unit 18 transfers the wafer W between the carrier C and the delivery unit 14 (process S106). Meanwhile, if the elevation state of the elevation pads 132cb is not normal (process S105: No), the control unit 18 stops the transfer of the wafer W between the carrier C and the delivery unit 14 (process S107).

Then, the control unit 18 determines whether the transfer of all wafers W is completed (process S108). If the transfer of the all the wafers W is not completed (process S108: No), the control unit 18 repeats the processings from the process S101. If the transfer of all the wafers W is completed (process S108: Yes), the control unit 18 finishes the processing.

<Modification Example of Arrangement of Supporting Portions 132c>

So far, the description has been provided for the case where the three elevation pads 132cb are equi-spaced on the circumference of the concentric circle CC imaginarily drawn from the center position CP of the reference position RP, that is, arranged on the circumference of the concentric circle CC at the equal angular interval of 120° (see FIG. 3C).

With this arrangement, it is possible to hold at least the processed wafer W with a uniform power distribution with respect to the reference position RP and contribute to the transferring the wafer W accurately without deviation. The arrangement of the supporting portions 132c, however, is not limited to this example.

Figure 6A:
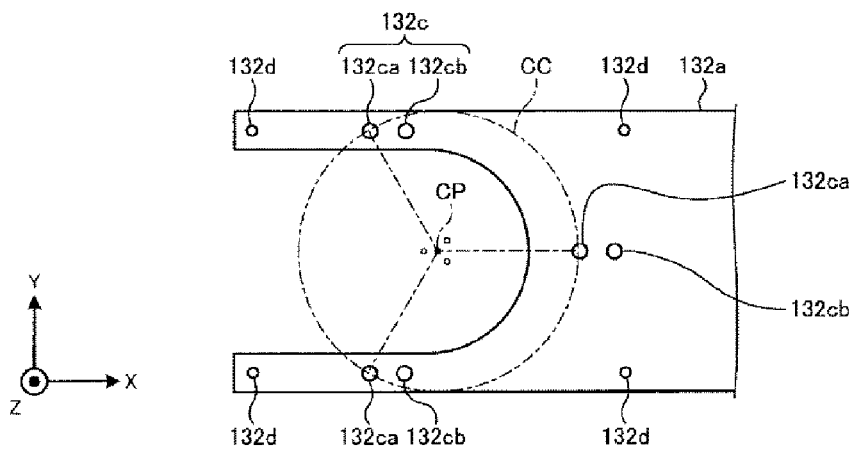
FIG. 6A is a first plan view illustrating a modification example of an arrangement of supporting portions.
Figure 6B:
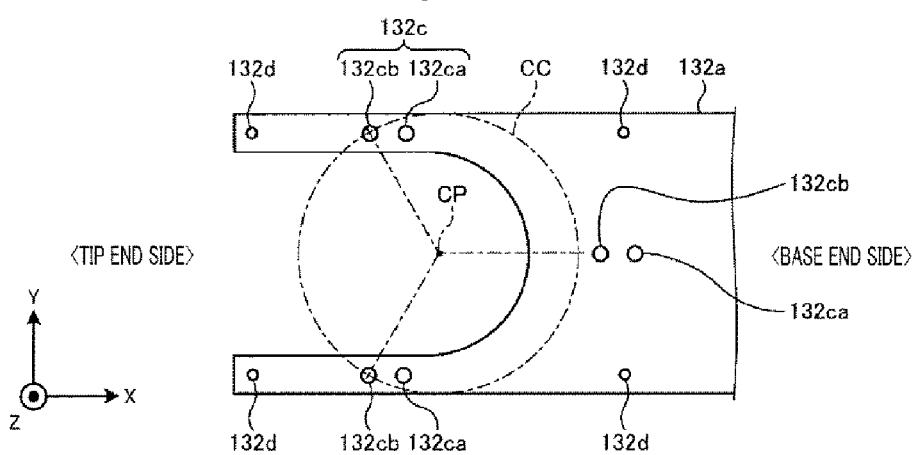
FIG. 6B is a second plan view illustrating a modification example of the arrangement of the supporting portions.
Figure 6C:
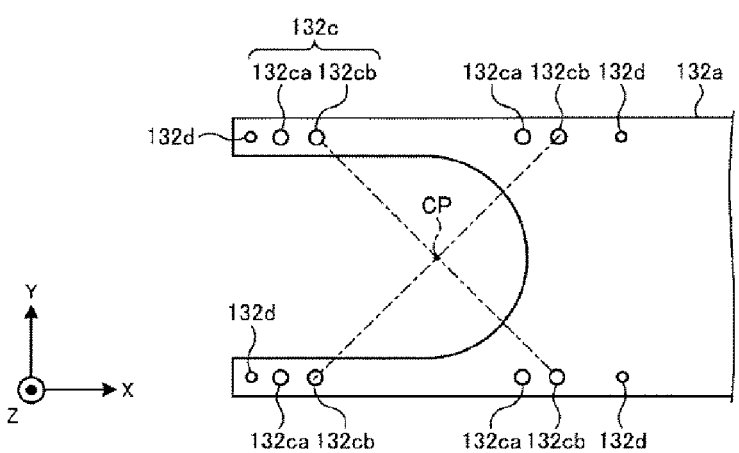
FIG. 6C is a third plan view illustrating a modification example of the arrangement of the supporting portions.

Now, modification examples of the arrangement of the supporting portions 132c will be explained with reference to FIG. 6A to FIG. 6C. FIG. 6A to FIG. 6C are first to third plan views illustrating the modification examples of the arrangement of the supporting portions 132c.

As depicted in FIG. 6A, the fixed pads 132ca of the supporting portions 132c, not the elevation pads 132cb, may be arranged at a regular interval on a circumference of a concentric circle CC imaginarily drawn from the center position CP. In this case, it is possible to hold at least a pre-processed wafer W with a uniform power distribution with respect to the aforementioned reference position RP.

Further, as shown in FIG. 6B, the fixed pads 132ca may be arranged at a base end side of the fork 132a with respect to the elevation pads 132cb. Furthermore, this arrangement relationship between the fixed pads 132ca and the elevation pads 132cb may not be same in all of the supporting portions 132c. Likewise, as depicted in FIG. 6B, all the elevation pads 132cb (or all the fixed pads 132ca), for example, may not necessarily be on the circumference of the concentric circle CC.

That is, the elevation pads 132cb or the fixed pads 132ca may not necessarily be arranged uniformly with respect to the center position CP, and may be appropriately arranged depending on a restriction such as an internal structure of the fork 132a or the like.

Furthermore, the number of the supporting portions 132c may not be limited to three. By way of example, as shown in FIG. 6C, the number of the supporting portions 132c may be four, more than three. By providing a larger number of supporting portions 132c, the frictional force between the supporting portions 132c and the rear surface of the wafer W can be enhanced, which may contribute to the transferring the wafer W accurately without deviation.

In the above-described examples, the number of the fixed pads 132ca and the number of the elevation pads 132cb are plural. However, only one fixed pad 132ca and only one elevation pads 132cb may be provided as long as the wafer W can be held thereon by the frictional force from below. In such a case, the single fixed pad 132ca and the single elevation pad 132cb may be concentrically arranged to have a double-ring shape smaller than the diameter of the wafer W.

<Configuration of Substrate Transfer Device 17>

Figure 7A:
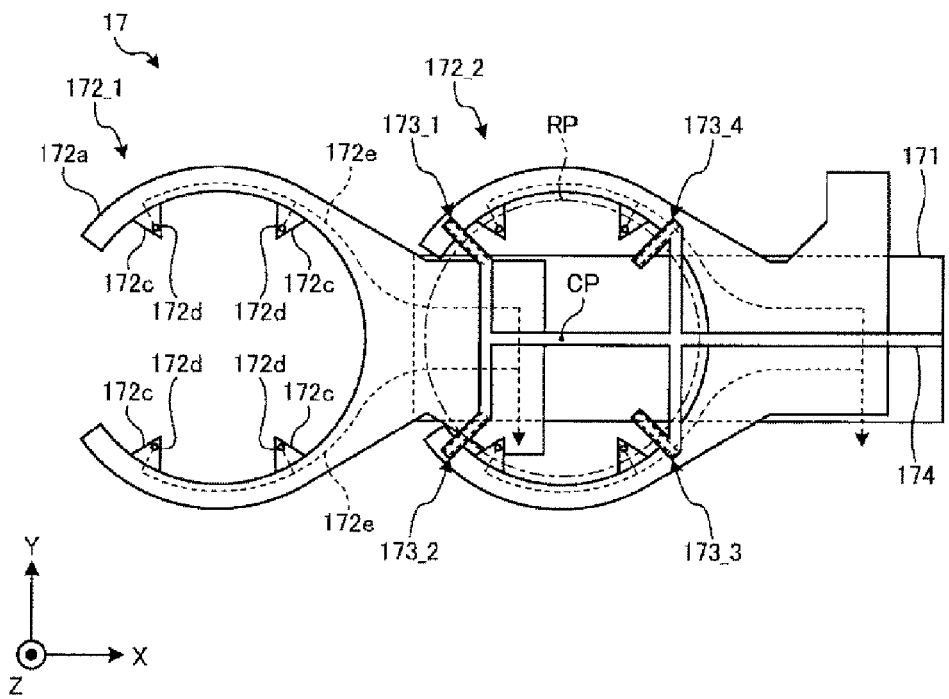
FIG. 7A is a plan view illustrating a configuration of a second transfer device.

Now, a configuration of the substrate transfer device 17 (corresponding to an example of a "second transfer device") according to the present exemplary embodiment will be explained with reference to FIG. 7A. FIG. 7A is a plan view illustrating the configuration of the substrate transfer device 17.

As depicted in FIG. 7A, the substrate transfer device 17 according to the present exemplary embodiment includes a base 171, a plurality of (here, two) holding units 172_1 and 172_2, a multiple number of (here, four) detecting units 173_1 to 173_4, and a supporting member 174.

The base 171 is configured to be movable along the X-axis direction and rotatable around the Z-axis. The holding units 172_1 and 172_2, the detecting units 173_1 to 173_4 and the supporting member 174 are provided at the base 171.

Each of the holding units 172_1 and 172_2 is configured to be capable of holding a single sheet of wafer W, and the holding units 172_1 and 172_2 are arranged in two levels in the Z-axis direction. Further, each of the holding units 172_1 and 172_2 is equipped with a non-illustrated moving mechanism and is configured to be independently movable forwards and backwards by the moving mechanism along the X-axis direction in the example shown in FIG. 7A.

Accordingly, it is possible to perform an operation of holding a pre-processed wafer W and taking the pre-processed wafer W from the delivery unit 14 by the holding unit 172_1 and an operation of holding a processed wafer W and returning the processed wafer W back into the delivery unit 14 by the holding unit 172_2.

Furthermore, since the holding units 172_1 and 172_2 have the substantially same configuration, reference numerals are omitted for some components of the holding unit 172_2 in FIG. 7A. In the following, the holding units 172_1 and 172_2 will be generically referred to as a "holding unit 172."

The holding unit 172 includes a fork 172a. The fork 172a has an arc shape having an inner diameter larger than the diameter of the wafer W. Further, the fork 172a is provided with a plurality of (here, four) supporting portions 172c. The supporting portions 172c are arranged at an inner periphery of the arc-shaped fork 172a and hold the peripheral portion of the wafer W from below.

Further, each of the supporting portions 172c has a suction opening 172d. The suction openings 172d are respectively connected to a line 172e formed within the fork 172a, for example. In the present exemplary embodiment, the line 172e is connected to a non-illustrated vacuum pump.

That is, the supporting portions 172c are members configured to hold the wafer W placed thereon by suctioning. By holding the wafer W through the suctioning, the supporting portions 172c are capable of determining a horizontal position of the peripheral portion of the wafer W. Further, as compared to the substrate transfer device 13 configured to hold the wafer W by the frictional force, it is possible to transfer the wafer W accurately without deviation. In the present exemplary embodiment, though the wafer W is attracted by the vacuum pump, it is also possible to attract the wafer W by using an electrostatic chuck.

The detecting units 173_1 to 173_4 are configured to detect the edge of the wafer W held by the holding unit 172 at different positions. Further, since the detecting units 173_1 to 173_4 correspond to and have the same configuration as the detecting units 133_1 to 133_4 of the substrate transfer device 13 as described above, detailed description thereof will be omitted here. Further, since the supporting member 174 corresponds to the supporting member 134 of the substrate transfer device 13, elaboration thereof will also be omitted. Likewise, description of a reference position RP and a center position CP shown in FIG. 7A will also be omitted.

<Estimating Problem of Substrate Transfer Device 13 by Using Substrate Transfer Device 17>

Generally, an apparatus may suffer a problem caused by aging degradation of mechanical parts constituting constituent components thereof. The substrate processing system 1, for example, includes constituent components, such as the substrate transfer device 13, the substrate transfer device 17 and the substrate holding mechanism 30 of the processing unit 16, provided with driving mechanisms in various structures to implement various functions for processing the wafer W.

Aging degradation of the driving mechanism may include deformation or abrasion of a driving portion or a portion in contact with the driving portion, extension of a belt, deformation/abrasion or contamination of a supporting portion in contact with an object to be supported, and so forth. From the viewpoint of suppressing occurrence of the problems that might be caused by these degradations, it may be desirable to figure out signs of the problems including the aging degradation.

In this regard, in the present exemplary embodiment, in a transfer of the wafer W between the substrate transfer device 13 and the substrate transfer device 17 through the delivery unit 14, a problem that might be included in the substrate transfer device 13 is estimated based on a deviation amount of the wafer W detected by the substrate transfer device 17.

This is possible because the sign of the problem, for example, abrasion or contamination of each of the pads 132ca and 132cb of the supporting portions 132c may be easily shown as the deviation amount of the wafer W from the reference position RP detected in the substrate transfer device 17 since, as stated above, the wafer W being transferred is held by the frictional force in the substrate transfer device 13.

Further, in the substrate transfer device 17, since the wafer W is held by the attraction as stated above, it is possible to determine the horizontal position of the wafer W with higher accuracy as compared to the substrate transfer device 13. Therefore, it is desirable to detect the deviation amount based on the substrate transfer device 17.

Figure 7B:
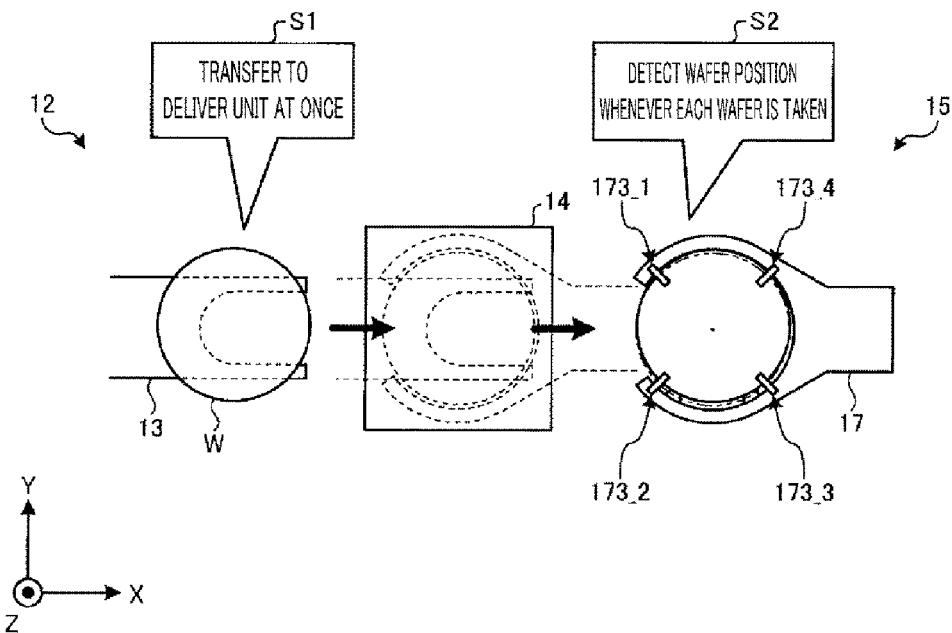
FIG. 7B is a first diagram for describing a case of estimating a problem of the first transfer device by using the second transfer device.
Figure 7C:
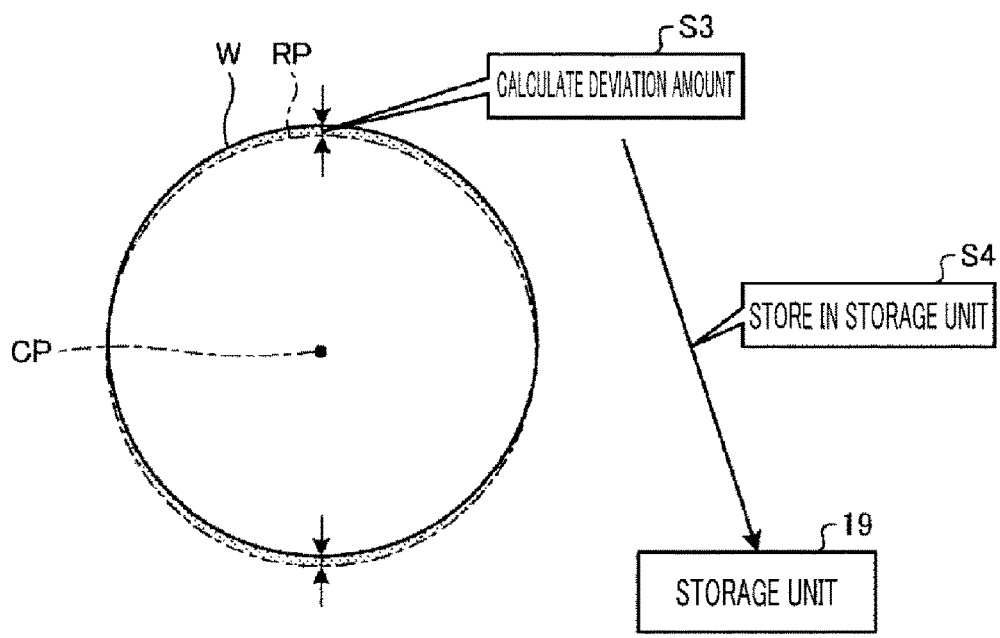
FIG. 7C is a second diagram for describing the case of estimating the problem of the first transfer device by using the second transfer device.
Figure 7D:
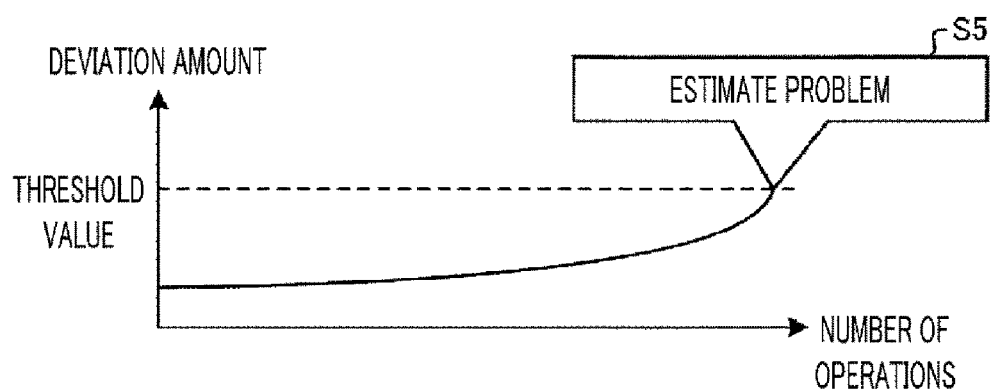
FIG. 7D is a third diagram for describing the case of estimating the problem of the first transfer device by using the second transfer device.

Hereinafter, a case of estimating the problem of the substrate transfer device 13 by using the substrate transfer device 17 will be explained in detail with reference to FIG. 7B to FIG. 7D. FIG. 7B to FIG. 7D are first to third diagrams for describing the case of estimating the problem of the substrate transfer device 13 by using the substrate transfer device 17.

First, in the transfer section 12, a plurality of (five in the present exemplary embodiment) wafers W is taken from the carrier C by the substrate transfer device 13 and transferred altogether into the delivery unit 14, as shown in FIG. 7B (process S1). Further, in the delivery unit 14, the transferred wafers W are held in multiple levels.

In the transfer section 15, the substrate transfer device 17 accesses the delivery unit 14, and takes out the wafers W one by one and transfers the wafer W into the processing unit 16. At this time, whenever each wafer W is taken out from the delivery unit 14 by the substrate transfer device 17, the control unit 18 controls the detecting units 173_1 to 173_4 to detect a position of the wafer W (process S2).

Then, as shown in FIG. 7C, the control unit 18 calculates a deviation amount of the wafer W from the reference position RP and the center position CP thereof based on the detection results from the detecting units 173_1 to 173_4 (process S3). The deviation amount calculated by the control unit 18 is stored in the storage unit 19 in time series (process S4).

Thereafter, as depicted in FIG. 7D, based on the time series data of the deviation amount stored in the storage unit 19, the control unit 18 assumes that there is a problem in the substrate transfer device 13 if the deviation amount exceeds a preset threshold value at, for example, a certain "number of operations" corresponding to the time axis (process S5), and then, stops the processing. Further, it may also be assumed that there is a problem when it is determined, based on the past tendency, that if the processing is continued, the deviation amount may exceed the threshold value as well as when the deviation amount exceeds the threshold value. For the purpose, the time series data of the deviation amount calculated whenever the problem is assumed in the past may be stored as accumulation data, and the control unit 18 may determine the past tendency by performing, for example, statistical analysis on these accumulation data.

Further, it is desirable that the time series data of the deviation amount is stored in the storage unit 19 in relation to each level of the delivery unit 14 on which each single wafer W is held. If so, the control unit 18 is capable of checking out the time series data of the deviation amount for each level of the delivery unit 14, that is, for each of the forks 132a_1 to 132a_5 of the holding unit 132 corresponding to each level of the delivery unit 14. Thus, the control unit 18 is easily capable of specifying the place (for example, one of the forks 132a_1 to 132a_5) having the problem. Further, information on a destination among the levels of the delivery unit 14 where each of the forks 132a_1 to 132a_5 of the substrate transfer device 13 transfers the wafer W is stored, and the time series data of the deviation amount may be related to the stored information (the destination among the levels of the delivery unit 14 where each fork transfers the wafer W) when the substrate transfer device 17 takes out the wafer W from the delivery unit 14.

Furthermore, the control unit 18 may set the aforementioned threshold value to have multiple levels. If the deviation amount exceeds the threshold value at an alarm level, the control unit 18 may notify the operator for the purpose of urging a maintenance work such as cleaning.

<Transfer Sequence of Wafer W Between Substrate Transfer Device 13 and Substrate Transfer Device 17 Through Delivery Unit 14>

Figure 8:
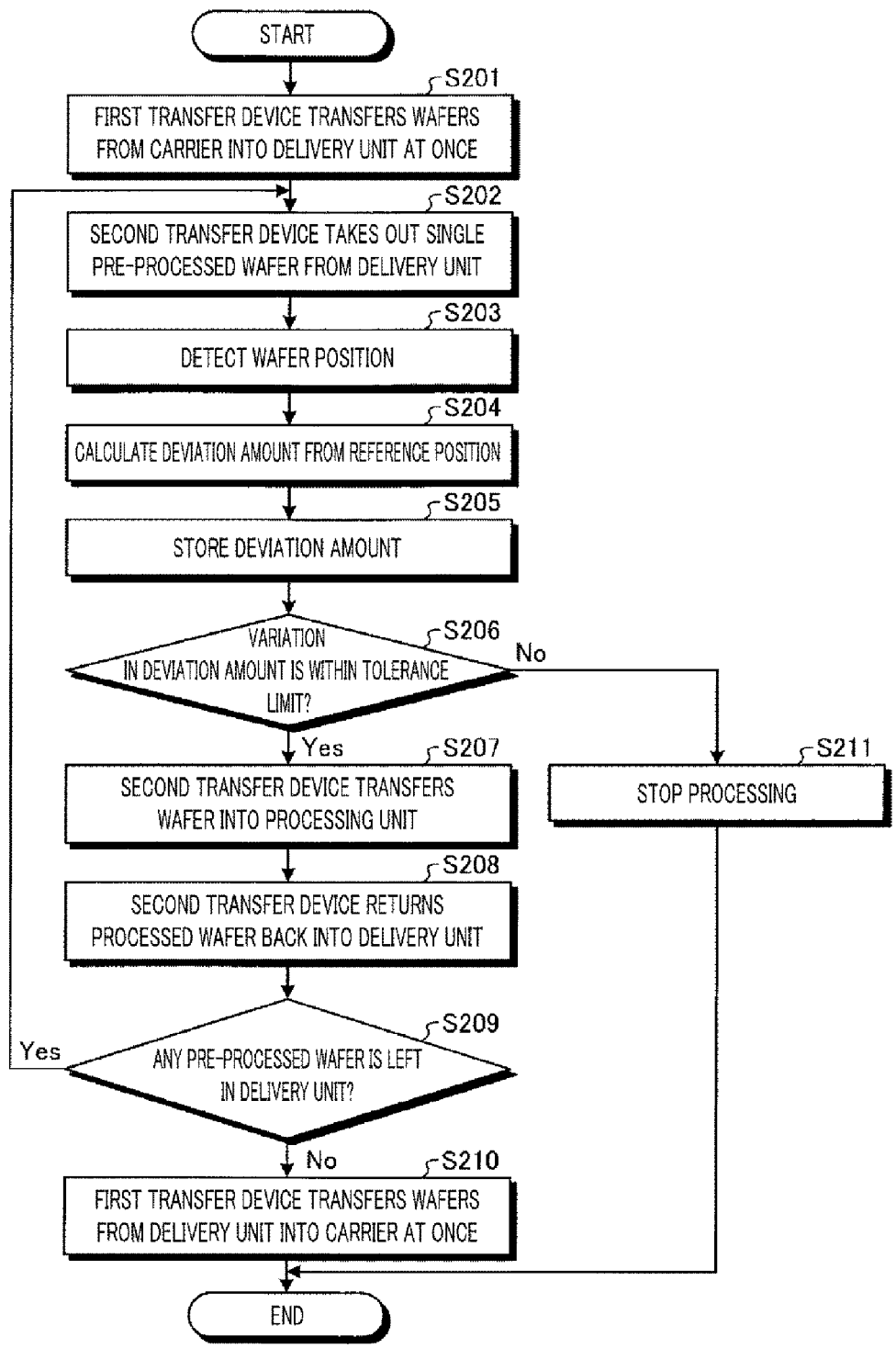
FIG. 8 is a flowchart for describing a processing sequence of a wafer transfer process between the first transfer device and the second transfer device via the delivery unit.

Now, a processing sequence of a transfer processing, in which the control unit 18 controls the substrate transfer device 13 and the substrate transfer device 17 to transfer the wafer W through the delivery unit 14, will be explained with reference to FIG. 8. FIG. 8 is a flowchart for describing the processing sequence of the transfer processing for the wafer W between the substrate transfer device 13 and the substrate transfer device 17 through the delivery unit 14.

As depicted in FIG. 8, the control unit 18 first transfers the wafers W from the carrier C into the delivery unit 14 at once by the substrate transfer device 13 (first transfer device) based on, e.g., recipe information in which a processing sequence of a substrate processing is previously set (process S201).

Subsequently, under the control of the control unit 18, the substrate transfer device 17 (second transfer device) takes out the pre-processed wafers W from the deliver unit 14 one by one (process S202). Then, the control unit 18 controls the detecting units 173_1 to 173_4 to detect the position of each taken wafer W (process S203).

Thereafter, the control unit 18 calculates the deviation amount of the wafer W, which is taken from the delivery unit 14, from the reference position RP based on the detection results of the detecting units 173_1 to 173_4 (process S204). Then, the control unit 18 stores the calculated deviation amount in the storage unit 19 in time series (process S205).

Afterwards, based on the time series data of the deviation amount, the control unit 18 determines whether a variation of the deviation amount is within a tolerance limit, that is, whether or not the deviation amount exceeds the aforementioned preset threshold value (process S206).

Here, if the deviation amount is within the tolerance range (process S206: Yes), the control unit 18 transfers the wafer W into the processing unit 16 by the substrate transfer device 17 (process S207). Then, the processed wafer W by the processing unit 16 is returned back into the delivery unit 14 by the substrate transfer device 17 under the control of the control unit 18 (process S208).

Then, the control unit 18 determines whether there remains any pre-processed wafer W in the delivery unit 14 (process S209). If there is the remaining pre-processed wafer W (process S209: Yes), the processings from the process S202 are repeated.

Meanwhile, if there remains no pre-processed wafer W in the delivery unit 14 (process S209: No), the control unit 18 transfers the processed wafers W at once from the delivery unit 14 back into the carrier C by the substrate transfer device 13 (process S210), and the processing is ended.

Furthermore, if the deviation amount is found to be out of the tolerance range in the process S206, (process S206: No), the control unit 18 stops the processing (process S211), and the processing is ended.

Further, though not shown in FIG. 8, if a part of the forks 132a_1 to 132a_5, for example, only one of them exhibits the variation of deviation amount different from those of the others, the control unit 18 may assume that there is (or is generated) a problem in that fork.

Furthermore, if all the forks 132a_1 to 132a_5 show the same variation of the deviation amount, the control unit 18 may assume that there is (or is generated) a problem in a component other than the forks 132a_1 to 132a_5.

That is, based on the difference among the deviation amounts of the forks 132a_1 to 132a_5 of the holding unit 132, the control unit 18 determines whether any one of the forks 132a_1 to 132a_5 has a problem or a component other than the forks 132a_1 to 132a_5 has a problem. Accordingly, regarding the component having the problem in the substrate transfer device 13, it can be at least distinguished whether it is the fork or not.

In case that the component having the problem is the fork, the control unit 18 may assume, based on the time series data, that the cause of the problem is, for example, contamination of each of the pads 132ca and 132cb, and may notify the operator of the time to perform cleaning. Further, the control unit 18 may assume that the cause of the problem is abrasion of each of the pads 132ca and 132cb by considering the number of cleanings performed in the past or the like as well, and may notify the operator of the time to replace each of the pads 132ca and 132cb.

Further, in case that the component having the problem is other than the fork, the control unit 18 may assume that the cause of the problem is, for example, degradation of the driving mechanism, and may notify the operator of the time to grease up a linear motion guide constituting the driving mechanism, or the time to replace a pulley belt, or the like.

So far, the description has been provided for the case where the problem of the substrate transfer device 13 is estimated based on the detection results of the detecting units 173_1 to 173_4 of the substrate transfer device 17. However, it is also possible to estimate the problem of the substrate transfer device 13 by using the detecting units 133_1 to 133_4 of the substrate transfer device 13 itself.

To elaborate, in this case, the control unit 18 calculates the deviation amount before and after the transfer into the delivery unit 14 from the carrier C and the deviation amount before and after the transfer into the carrier C from the delivery unit 14 based on the detection results of the detecting units 133_1 and 133_4, and then, stores these deviation amounts in the storage unit 19 as time series data. Then, as in the case of using the detecting units 173_1 to 173_4 of the substrate transfer device 17, the control unit 18 may determine whether the variation in the deviation amounts is within a tolerance range based on the time series data, and, based on the determination result, may notify the operator of the time to clean or replace each of the pads 132ca and 132cb, for example.

As stated above, the substrate transfer device 13 according to the exemplary embodiment includes the fixed pads 132ca (corresponding to an example of "first supporting portions"), the elevation pads 132cb (corresponding to an example of "second supporting portions"), and the elevating mechanism 150.

The fixed pads 132ca and the elevation pads 132cb are configured to support the wafer W (corresponding to an example of "substrate") from below.

The elevating mechanism 150 is configured to elevate the elevation pad 132cb up and down between the height b (corresponding to an example of "first position") higher than the height a of the fixed pads 132ca and the height b' (corresponding to an example of "second position") lower than the height a of the fixed pads 132ca.

Accordingly, according to the substrate transfer device 13, the generation of dust from the peripheral portion of the wafer W can be suppressed, and the processed wafer W can be suppressed from being adversely affected by the pre-processed wafer W.

Further, as stated above, the substrate transfer device 13 according to the present exemplary embodiment includes the fork 132*a* (corresponding to an example of a "base portion"), the elevation pads 132*cb* (corresponding to an example of a "supporting portion"), the elevating mechanism 150 and the substrate detecting mechanism 80 (corresponding to an example of a "detecting mechanism").

The fork 132*a* is the base portion of the holding unit 132 configured to hold the wafer W (corresponding to an example of a "substrate"). The elevation pads 132*cb* are provided at the fork 132*a* and support the wafer W from below the wafer W.

The elevating mechanism 150 is configured to move the elevation pads 132*cb* up and down with respect to the fork 132*a*. The substrate detecting mechanism 80 detects the elevation states of the elevation pads 132*cb*.

According to the substrate transfer device 13 having this configuration, it is possible to investigate the actual elevation states of the elevation pads 132*cb* which are elevated up and down to support the wafer W.

Other Exemplary Embodiments

Figure 9:
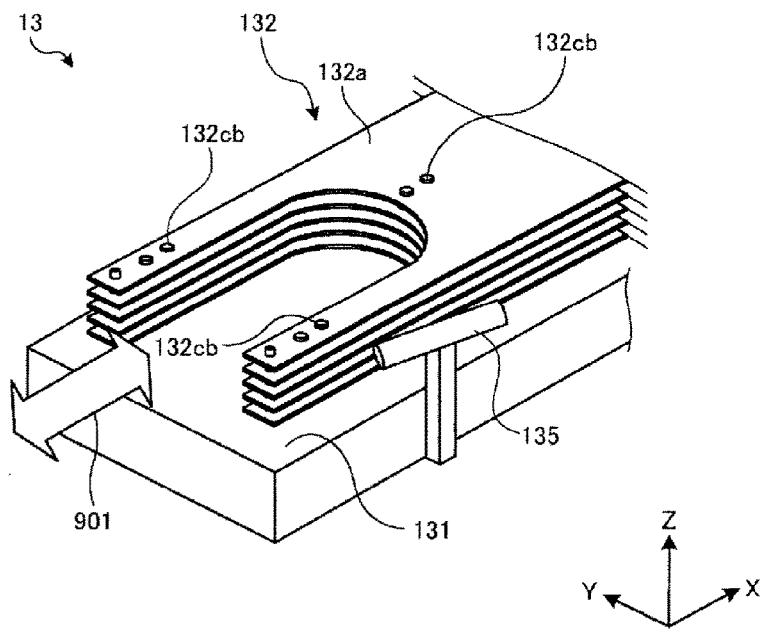
FIG. 9 is a perspective view illustrating a configuration of a first transfer device according to another exemplary embodiment.

Other exemplary embodiments will be explained with reference to FIG. 9. FIG. 9 is a perspective view illustrating a configuration of a substrate transfer device 13 according to another exemplary embodiment. As depicted in FIG. 9, the substrate transfer device 13 according to another exemplary embodiment may be equipped with a camera 135 provided at, for example, the base 131.

By the camera 135, an operation while the forks 132*a* of the holing unit 132 are moved forwards and backwards with respect to the base 131 and the wafers W are being carried into/out of the carrier C or the delivery unit 14 or while the wafer W is being transferred between the carrier C and the delivery unit 14 is imaged all the time. Therefore, the cause of the problem, if any, can be efficiently investigated.

It is desirable to provide the camera 135 such that a forward/backward movement direction (see an arrow 901 in the figure) of the forks 132*a*, gaps between the forks 132*a*, and so forth are included in an imaging range thereof. Further, though one camera 135 is illustrated in FIG. 9, a multiple number of cameras 135 may be provided.

Furthermore, the images obtained by this camera 135 may be used to detect the elevation state of the elevation pads 132*cb*. Further, without being limited to the substrate transfer device 13, the camera 135 may be provided at the substrate transfer device 17 or other devices or mechanisms that might suffer the problem which may be caused by aging degradation or the like and affect the whole system.

Moreover, in the above-described exemplary embodiments, the fixed pads 132*ca* and the elevation pads 132*cb* have the substantially circular shape when viewed from the top. However, they are not limited to the circular shape. In addition, the fixed pads 132*ca* and the elevation pads 132*cb* may not be provided in pairs, but the number of the fixed pads 132*ca* and the number of the elevation pads 132*cb* may be different.

In the above-described exemplary embodiments, the positional relationship between the light projecting unit 81*a* and the light receiving unit 81*b* of the substrate detecting mechanism 80 and the positional relationship between the light projecting unit 133*a* and the light receiving unit 133*b* of each of the detecting units 133_1 to 133_4 are described but not limited thereto. By way of example, the light projecting unit 81*a* and the light receiving unit 81*b* may be arranged at the reverse positions to those mentioned above. Likewise, the light projecting unit 133*a* and the light receiving unit 133*b* may be located at the reverse positions to those stated above.

Further, these may not be of a light transmission type but be of a light reflection type. In case that they are the light reflection type devices, both of the light projecting unit 81*a* and the light receiving unit 81*b* and both of the light projecting unit 133*a* and the light receiving unit 133*b* may be arranged at a same side.

In addition, in the above-described exemplary embodiments, the detection of the elevation state of the elevation pads 132*cb* is performed by using the substrate detecting mechanism 80 provided to correspond to the carrier C. However, a device for this detection and a detection region thereof may not be limited thereto. By way of non-limiting example, a detecting mechanism may be provided at the delivery unit 14, and the elevation state of the elevation pads 132*cb* may be detected thereat. In such a case, the detecting mechanism may not be optical sensors but may be a distance sensor, a proximity sensor, or the like. Further, a detecting unit equipped with a suctioning mechanism may be allowed to approach the elevation pads 132*cb*, and then, the detection of the elevation state of the elevation pads 132*cb* may be performed through a pressure variation of the suctioning mechanism.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate transfer device, comprising:
at least one first supporting portion and at least one second supporting portion configured to support a substrate from below the substrate;
an elevating mechanism configured to elevate the at least one second supporting portion up and down between a first position higher than a height of the at least one first supporting portion, which is maintained fixed, and a second position lower than the height of the at least one first supporting portion;
a control unit configured to control the elevating mechanism; and
a detecting unit configured to detect an external surface of the at least one second supporting portion,
wherein the control unit determines whether the at least one second supporting portion is in a required elevation state based on a detection result of the detecting unit,
the detecting unit includes a light projecting unit configured to irradiate light, and a light receiving unit configured to receive the light irradiated from the light projecting unit, and
the control unit controls the detecting unit to overlap an optical axis of the light with the at least one second supporting portion.

2. The substrate transfer device of claim 1,
wherein the at least one second supporting portion is plural in number, and the plural second supporting portions are arranged on a circumference of a single concentric circle at a regular interval imaginarily drawn from a center of a preset reference position of the substrate supported by the second supporting portions.

3. The substrate transfer device of claim 1,
wherein the at least one first supporting portion is plural in number, and
the plural first supporting portions are arranged on a circumference of a single concentric circle at a regular interval imaginarily drawn from a center of a preset reference position of the substrate supported by the first supporting portions.

4. The substrate transfer device of claim 1,
wherein the at least one first supporting portion is plural in number and the at least one second supporting portion is plural in number, and
one first supporting portion and one second supporting portion are configured as one pair, and at least three pairs are provided.

5. The substrate transfer device of claim 1,
wherein the at least one first supporting portion and the at least one second supporting portion are configured to hold the substrate by a frictional force applied on contact surfaces where the substrate is in contact with the at least one first supporting portion and the at least one second supporting portion.

6. The substrate transfer device of claim 5,
wherein at least the contact surfaces of the at least one first supporting portion and the at least one second supporting portion are made of rubber.

7. A substrate transfer device of claim 1, further comprising:
a deviation preventing member which has a height higher than the first position and is provided at a position where a deviation of the substrate is allowed to be within a preset tolerance limit.

8. A substrate transfer device of claim 1,
wherein the control unit controls the elevating mechanism to lower the at least one second supporting portion to the second position when transferring the substrate before processed, and controls the elevating mechanism to raise the at least one second supporting portion to the first position when transferring the substrate after processed.

9. A substrate transfer method in a substrate transfer device including a first supporting portion and a second supporting portion configured to support a substrate from below the substrate; an elevating mechanism configured to elevate the second supporting portion up and down between a first position higher than a height of the first supporting portion, which is maintained fixed, and a second position lower than the height of the first supporting portion; and a detecting unit including a light projecting unit configured to irradiate light and a light receiving unit configured to receive the light irradiated from the light projecting unit, and configured to detect an external surface of the second supporting portion, the substrate transfer method comprising:
supporting the substrate on the first supporting portion when transferring the substrate before processed, and supporting the substrate at the first position on the second supporting portion when transferring the substrate after processed;
controlling the detecting unit to overlap an optical axis of the light with the second supporting portion; and
determining whether the second supporting portion is in a required elevation state based on a detection result of the detecting unit.

* * * * *